US008217348B2

(12) United States Patent
Iwasaki et al.

(10) Patent No.: US 8,217,348 B2
(45) Date of Patent: Jul. 10, 2012

(54) ELECTRON MICROSCOPE SYSTEM AND METHOD FOR EVALUATING FILM THICKNESS REDUCTION OF RESIST PATTERNS

(75) Inventors: Mayuka Iwasaki, Yokohama (JP); Chie Shishido, Kawasaki (JP); Maki Tanaka, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 650 days.

(21) Appl. No.: 12/354,823

(22) Filed: Jan. 16, 2009

(65) Prior Publication Data
US 2009/0212211 A1 Aug. 27, 2009

(30) Foreign Application Priority Data

Feb. 22, 2008 (JP) ................................ 2008-040818

(51) Int. Cl.
G01N 23/00 (2006.01)
G21K 7/00 (2006.01)
(52) U.S. Cl. ........ 250/310; 250/306; 250/307; 250/309; 250/491.1; 250/492.2
(58) Field of Classification Search .................. 259/306, 259/307, 309, 310, 491.1, 492.1
See application file for complete search history.

(56) References Cited

U.S. PATENT DOCUMENTS
5,702,861 A * 12/1997 Niikura et al. ................ 430/191
2007/0177787 A1 * 8/2007 Maeda et al. ................. 382/141

OTHER PUBLICATIONS
Focus Report with English translation.
Handbook of Image Analysis with English translation.

* cited by examiner

Primary Examiner — Jack Berman
Assistant Examiner — Meenakshi Sahu
(74) Attorney, Agent, or Firm — Antonelli, Terry, Stout & Kraus, LLP.

(57) ABSTRACT

The invention provides a system for achieving detection and measurement of film thickness reduction of a resist pattern with high throughput which can be applied to part of in-line process management. By taking into consideration the fact that film thickness reduction of the resist pattern leads to some surface roughness of the upper surface of the resist, a film thickness reduction index value is calculated by quantifying the degree of roughness of the part corresponding to the upper surface of the resist on an electron microscope image of the resist pattern which has been used in the conventional line width measurement. The amount of film thickness reduction of the resist pattern is estimated by applying the calculated index value to a database previously made for relating a film thickness reduction index value to an amount of film thickness reduction of the resist pattern.

12 Claims, 10 Drawing Sheets

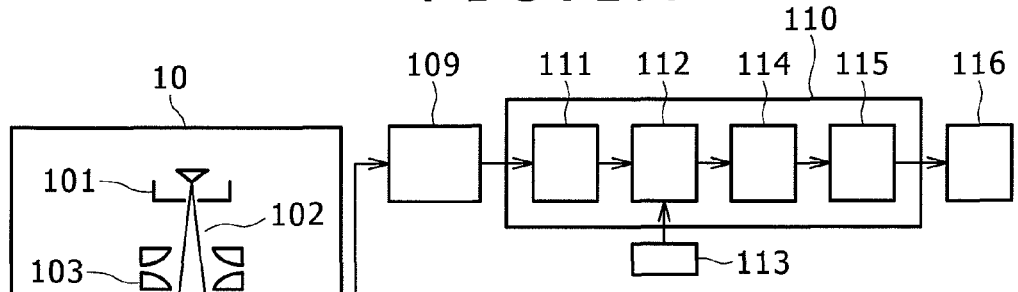
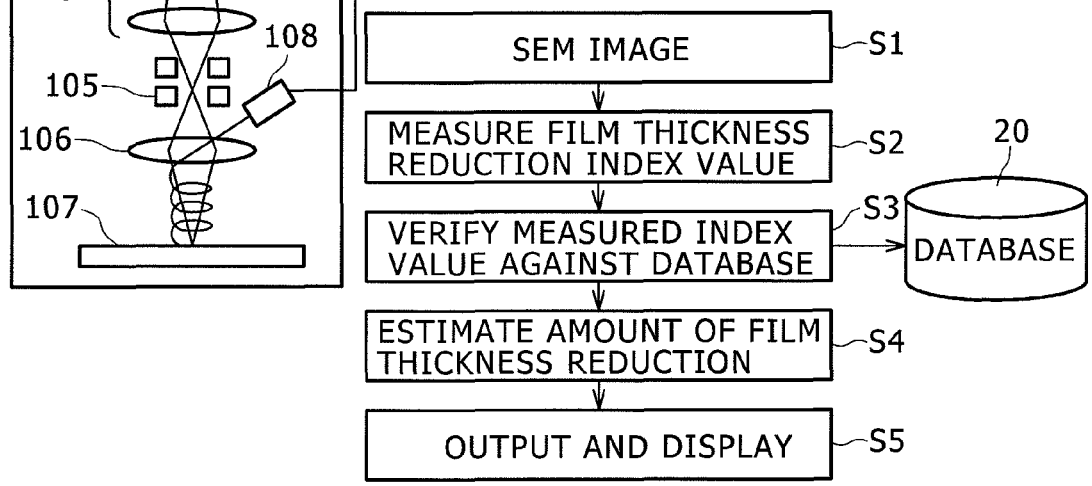
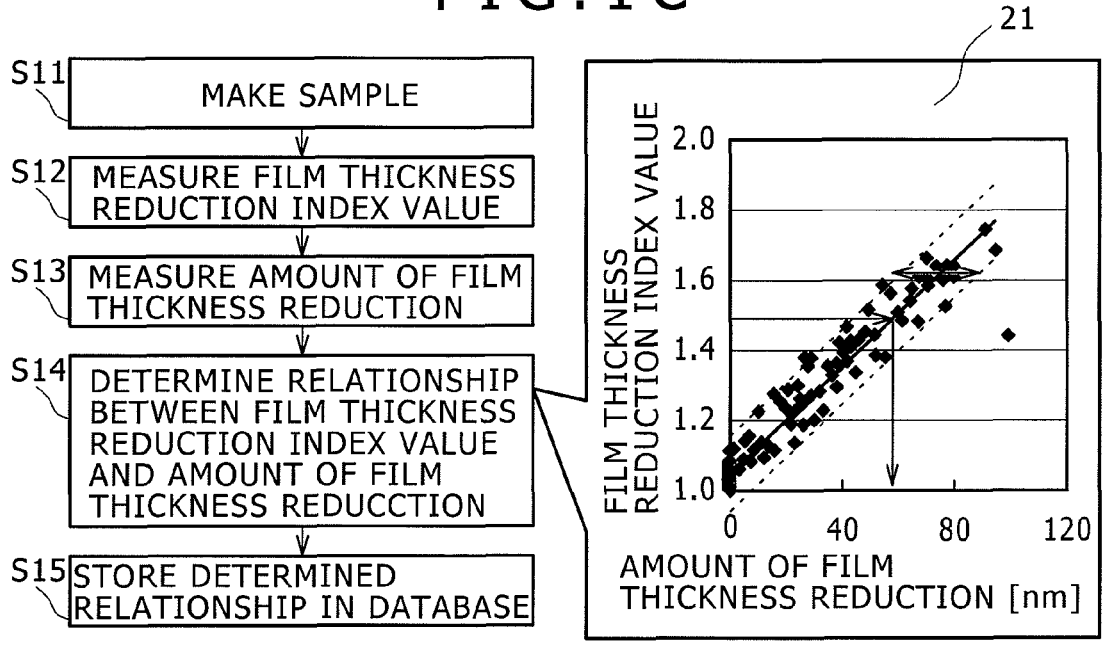

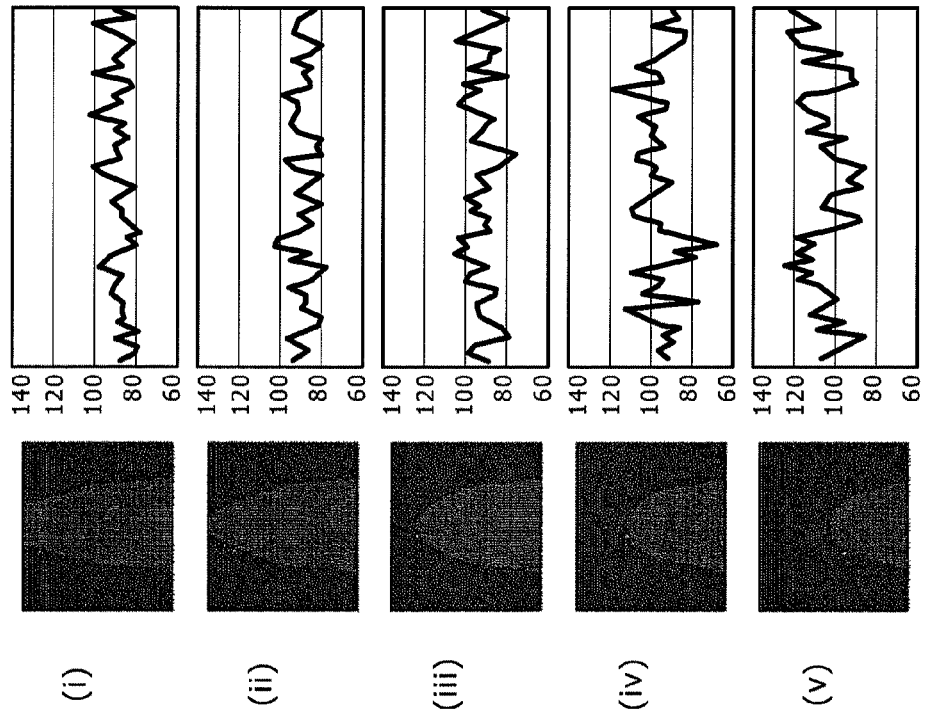

ELECTRON MICROSCOPE SYSTEM AND METHOD FOR EVALUATING FILM THICKNESS REDUCTION OF RESIST PATTERNS

The present application claims priority from Japanese application serial no. JP2008-040818, filed on Feb. 22, 2008, the content of which is hereby incorporated by reference into this application.

BACKGROUND OF THE INVENTION

The present invention relates to a method for evaluating and managing a resist pattern formed on a wafer in a semiconductor manufacturing process, and more particularly to a technique for measuring and evaluating the amount of film thickness reduction of a resist (a reduction in height of a resist pattern) using an electron microscope image of the resist pattern.

Conventionally, a length-measuring scanning electron microscope (SEM) which is an electron microscope for the purpose of measuring a dimension of the pattern is widely used as a process management tool in a lithography process. The length-measuring SEM enables imaging at high magnification of a hundred thousand times to three hundred thousand times, and thus can measure the dimension of a fine pattern of the order of several tens of nanometers with an accuracy of 1 nanometer or less. The basic structure of the length-measuring SEM is disclosed in Tatsuhiko Higashiki, Ed. "Photolithography II—Measurement and Control—", ED Research Co., Ltd., pp. 31-41 (2003).

The lithography process involves transferring a circuit pattern onto a wafer by exposure and development of a resist, and etching along the resist pattern transferred. The length-measuring SEM is used to measure the dimension of the transferred resist pattern or the pattern etched. In particular, wiring patterns including a transistor gate wiring are subjected to strict dimensional control because the width of the pattern is strongly related to device performance.

FIG. 2A shows sectional shapes of the patterns before etching, during etching, after etching in that order from left side thereof. The length-measuring SEM measures a resist pattern width W1, or a pattern width W2 after the etching.

In a conventional lithography process, the resist pattern width W1 within the standard allows the pattern width W2 after the etching to be restrained within the standard. Thus, sufficient process management is available by monitoring measurement results of the widths W1 and W2.

In order to satisfy the need for microfabrication of patterns, a high NA exposure technique has been developed for obtaining a resolution required for formation of a fine pattern. As a result, a margin for the exposure process becomes small, and a small variation of an exposure parameter, such as a dose amount or a focus position in exposure, leads to film thickness reduction of the resist pattern, that is, a decrease in height of the resist as compared to the case of the normal exposure.

As shown in FIG. 2B, when a height of a pattern is low (h1<H1) even with the same pattern width before etching as that shown in FIG. 2A (w1=W1), a pattern width after the etching becomes smaller (w2<W2). During the etching, the thickness of the resist is gradually decreased. When the original pattern thickness is low, the resist pattern almost disappears during etching, and then a film of interest for process may be itself etched as shown in the center drawing in FIG. 2B. As mentioned above, the pattern width after the etching is directly related to the device performance. The condition which may cause the reduction in pattern width after the etching as shown in FIG. 2B is not appropriate.

In order to introduce the high NA exposure technique, only measurement of the pattern width (W1, w1) is not sufficient in a resist pattern stage from a point of view of process management, and also a pattern height (H1, h1) is desired to be measured together with the width. Methods for measuring a pattern height can include measurement using an electron microscope for observation of a section of a wafer by dividing the wafer, and measurement using an atomic force microscope (AFM). The former needs dividing the wafer, which cannot be apparently applied to the normal in-line process management. The latter is not appropriate for use in monitoring the process which needs high throughput.

SUMMARY OF THE INVENTION

The invention provides a system for achieving detection and measurement of film thickness reduction of a resist pattern with high throughput which can be applied to part of in-line process management.

That is, the invention has been made by taking into consideration the following. When a resist pattern is formed under an exposure condition deviating from the normal exposure condition, the resist pattern has film thickness reduction together with some surface roughness (roughness) of the upper surface of the resist. Thus, the invention is adapted to calculate an index value of film thickness reduction of the resist pattern with respect to a resist pattern formed on the normal exposure condition by quantifying the degree of roughness of a part corresponding to the upper surface of the resist on an electron microscope image of the resist pattern.

The invention not only calculates a film thickness reduction index value, but also estimates the amount of film thickness reduction of a resist pattern actually formed as compared to the resist pattern formed on the normal exposure condition by applying the calculated index value to a database previously stored for relating a film thickness reduction index value to an amount of film thickness reduction of a resist pattern.

Further, the invention is adapted to make the database for relating the film thickness reduction index value to the amount of film thickness reduction of the resist pattern by calculating the index values from electron microscope images of the resist patterns formed under various exposure conditions, measuring the heights of the resist patterns by a height measuring device, and registering the relationship between the film thickness reduction index values and the results of measurement of the heights.

That is, the invention provides an electron microscope system which includes electron beam image obtaining means for obtaining an image of a specimen having a resist pattern formed on a surface thereof using a scanning electron microscope, quantifying means for quantifying a feature of variations in brightness of the image at a desired area of the resist pattern by processing the obtained image, index value calculating means for calculating an index value for relating the feature of variations in brightness of the image quantified by the quantifying means to an amount of reduction from a reference value of a film thickness of the resist pattern, and display means for displaying information about the index value calculated by the index value calculating means on a screen.

Further, the invention provides an electron microscope system which includes electron beam image obtaining means for obtaining an image of a specimen having a resist pattern formed on a surface thereof using a scanning electron microscope, quantifying means for quantifying a feature of variations in brightness of the image at a desired area of the resist pattern by processing the obtained image, index value calculating means for calculating an index value for relating the feature of variations in brightness of the image quantified by the quantifying means to an amount of reduction from a reference value of a film thickness of the resist pattern, estimation means for estimating the amount of reduction from the reference value of the film thickness of the resist pattern using the index value calculated by the index value calculating means, and display means for displaying information about the amount of reduction from the reference value of the film thickness of the resist pattern calculated by the estimation means on a screen.

Further, the invention provides a method for evaluating film thickness reduction of a resist pattern using an electron microscope system which includes the steps of obtaining an image of a specimen having a resist pattern formed on a surface thereof using a scanning electron microscope, quantifying a feature of variations in brightness of the image at a desired area of the resist pattern by processing the obtained image, calculating an index value for relating the feature of variations in brightness of the image quantified to an amount of reduction from a reference value of a film thickness of the resist pattern, and displaying information about the index value calculated on a screen.

Moreover, the invention provides a method for evaluating film thickness reduction of a resist pattern using an electron microscope system which includes the steps of obtaining an image of a specimen having a resist pattern formed on a surface thereof using a scanning electron microscope, quantifying a feature of variations in brightness of the image at a desired area of the resist pattern by processing the obtained image, calculating an index value for relating the feature of variations in brightness of the image quantified to an amount of reduction from a reference value of a film thickness of the resist pattern, estimating the amount of reduction from the reference value of the film thickness of the resist pattern using the calculated index value, and displaying information about the amount of reduction from a reference value of a film thickness of the resist pattern estimated on a screen.

Accordingly, the invention can detect and measure the film thickness reduction using the image, which has been used by a conventional line width measurement method, and thus can monitor the film thickness reduction, which is a serious process failure, without reducing a throughput of the conventional process management. The invention is applied to extraction of conditions for the exposure process, that is, optimization of the dose amount and focus position thereby to enable more effective setting of a process window as compared to the use of only the conventional line width measurement result.

These and other objects, features and advantages of the invention will be apparent from the following more particular description of preferred embodiments of the invention, as illustrated in the accompanying drawings.

BRIEF DESCRIPTION OF THE DRAWINGS

FIG. 1A is a diagram showing a configuration of a length-measuring SEM system having a function of measuring film thickness reduction according to a first embodiment of the invention;

FIG. 1B is a process flowchart of measurement of the film thickness reduction performed by an arithmetic processor in the first embodiment;

FIG. 1C is a flowchart showing procedures for making a database regarding a relationship between a film thickness reduction index value and an amount of film thickness reduction of a pattern actually formed based on a resist pattern formed on a normal exposure condition in the first embodiment;

FIG. 4A is a diagram showing SEM images of sections of various patterns with different amounts of film thickness reduction;

FIG. 4B is a diagram showing signal waveforms each obtained by adding up the SEM image signals corresponding to each sectional pattern in the Y-axis direction;

FIG. 4C is a histogram showing distribution of signal intensities determined from each signal waveform shown in FIG. 4B;

FIG. 4D is a signal waveform obtained by adding up the SEM image signals shown in FIG. 4A in the X-axis direction;

FIGS. 8B and 8C show flowcharts for explaining the first embodiment, in which FIG. 8B is a diagram showing a process flowchart of film thickness reduction measurement performed by an arithmetic processor in the third embodiment, and FIG. 8C is a flowchart showing procedures for making a database regarding a relationship between the film thickness reduction index value and the amount of film thickness reduction of a pattern actually formed based on a resist pattern formed on a normal exposure condition in the third embodiment;

DESCRIPTION OF THE PREFERRED EMBODIMENTS

Figure 2A:
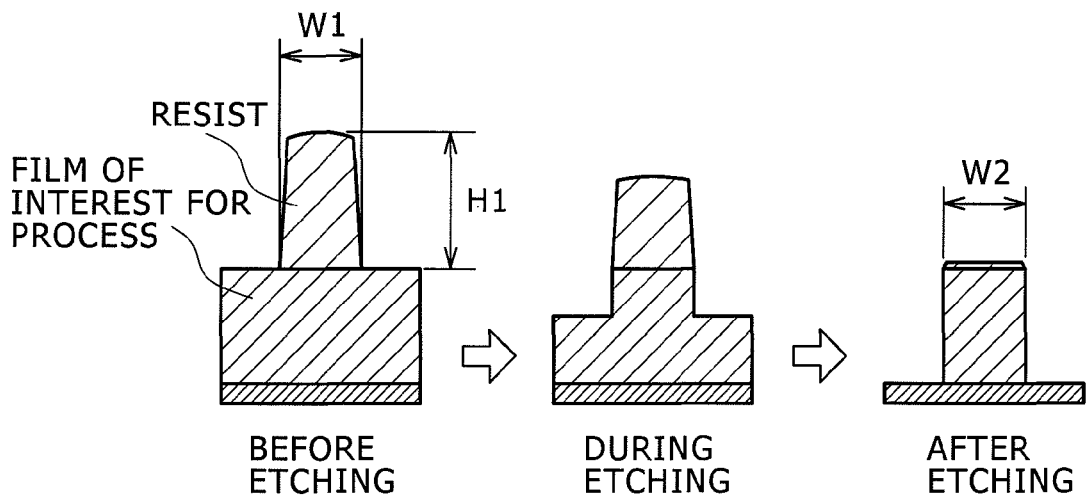
FIG. 2A shows pattern sectional shapes of a film of interest for the process having a high resist pattern formed thereon before etching, during etching, and after etching.
Figure 2B:
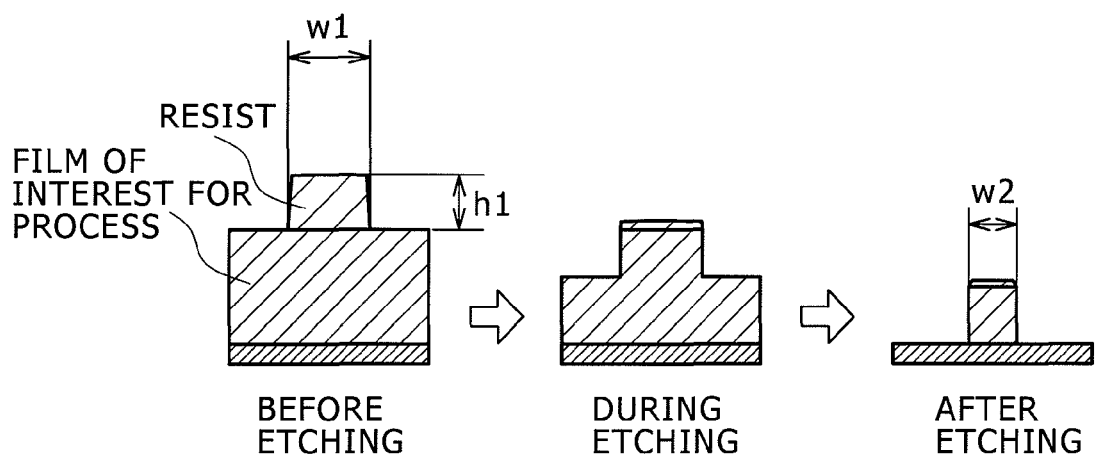
FIG. 2B shows pattern sectional shapes of a film of interest for the process having a low resist pattern formed thereon as compared to the case shown in FIG. 2A, before etching, during etching, and after etching.

Now, a method for measuring film thickness reduction of a resist using an electron microscope according to the invention will be described below with reference to the accompanying drawings.

(First Embodiment)

The configuration of an SEM system associated with the measurement method of film thickness reduction of the resist using the electron microscope of the invention, and the entire flow of the method will be described below. Then, each step of the method will be described in detail, and further, the SEM system employing thereon the method will be described.

[SEM System]

FIG. 1A shows a configuration of the length-measuring SEM system having a function of measuring film thickness reduction according to the first embodiment. The length-measuring SEM system of this embodiment includes an SEM main unit 10, an image processing and whole controller 109, an arithmetic processor 110, and a database section 113, and is connected to a data server 116 via a network.

The SEM main unit 10 includes an electron gun 101, an accelerating electrode 103 for accelerating an electron beam 102 emitted from the electron gun 101, a focusing lens 104, and a deflecting lens 105 for deflecting a track of the electron beam 102. The SEM main unit 10 also includes an objective lens 106 for controlling a position of focus of the electron beam 102 such that the focus position on which the electron beam 102 converges is positioned on a surface of a specimen 107 with a pattern formed thereon, and a detector 108 for detecting part of secondary electrons generated from the specimen 107 to which the electron beam 102 is applied. A detection signal of the detector 108 is fed to and processed by the image processing and whole controller 109 thereby to obtain an SEM image. The SEM image is processed in use by the arithmetic processor 110 with reference to information stored in the database section 113, and information regarding film thickness reduction is extracted. The result is fed to and stored in the data server 116 via a communication line.

The specimen 107 is put on a table (not shown). The table (not shown) is controlled by the image processing and whole controller 109 such that a desired area on the specimen is positioned at an area for irradiation of the electron beam 102.

The arithmetic processor 110 includes a film thickness reduction index value measuring section 111, a database verification section 112, a film thickness reduction amount estimating section 114, and an input and output section 115 with a display screen.

[Entire Flow]

FIG. 1B is an entire flowchart of measurement of film thickness reduction performed by the arithmetic processor 110.

(Step S1): A resist pattern is imaged by the SEM 10, and a signal obtained by the imaging is processed by the image processing and whole controller 109 to obtain an SEM image of the specimen.

(Step S2): An index value of film thickness reduction is calculated from the obtained image by a method to be described later.

(Step S3): The film thickness reduction index value calculated is verified against a database 20 which registers a relationship between film thickness reduction index values and amounts of film thickness reduction of patterns actually formed based on a resist pattern formed under a normal exposure condition stored in the database section 113. A method for making the database 20 will be described later using FIG. 1C.

(Step S4): The amount of film thickness reduction of the pattern actually formed according to the resist pattern formed under the normal exposure condition is estimated based on the result of verification. The verification result is displayed on a display screen of the input and output section 115.

The entire of the film thickness reduction measurement has been described. Each step of the flow will be described below in detail.

[Calculation of Film Thickness Reduction Index Value]

Step S2 shown in FIG. 1B will be described below in detail. The film thickness reduction of the pattern actually formed based on the resist pattern formed under a normal exposure condition is caused by applying excessive light to a resist pattern portion to which the light should not be applied inherently, in particular, an upper portion of the resist pattern. The irradiation of the upper portion of the resist pattern with the excessive light may be caused by focus displacement in exposure, or by an increase in dose amount.

Resist material commonly used has such properties that the more the amount of irradiated light, the larger the roughness of a surface (surface roughness). The film thickness reduction is caused by irradiating the resist pattern upper portion with the excessive light, which inevitably leads to roughness of the surface of the upper portion of the resist pattern.

In the invention, this mechanism is used to quantify a change in roughness of the surface of the pattern upper portion on the SEM image together with the film thickness reduction, and the quantified change is used as a film thickness reduction index value.

Figure 3A:
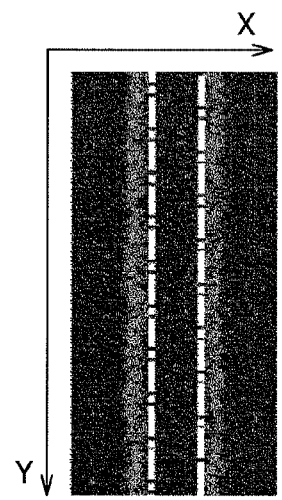
FIG. 3A is a diagram showing an SEM image of a pattern on a film of interest for the process which does not cause the film thickness reduction after the etching.
Figure 3B:
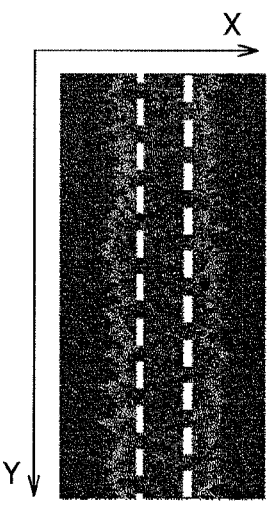
FIG. 3B is a diagram showing the SEM image of another pattern on another film of interest having a reduced thickness after the etching.

FIG. 3A shows an SEM image without film thickness reduction, and FIG. 3B shows an SEM image having film thickness reduction. In the SEM image, a flat portion is detected to be dark, and an inclined portion is detected to be bright by an inclined angle effect. The edge of the surface with roughness is detected to be bright in a streaky manner. As shown in FIG. 3A, a portion enclosed by a dotted line corresponds to the upper surface of the resist pattern. The reason for irregular bright areas shown in FIG. 3B is due to existence of the roughness as compared to the case shown in FIG. 3A. Now, methods for quantifying features on the image include the following examples.

Figure 3C:
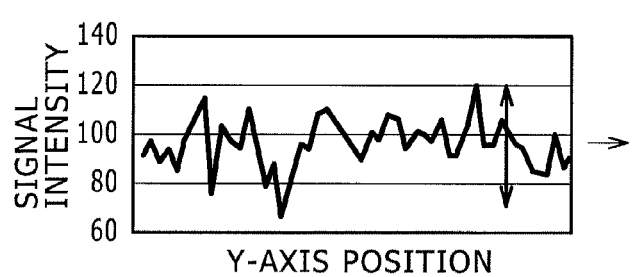
FIG. 3C is a diagram showing a signal waveform obtained by adding up SEM image signals shown in FIG. 3A or 3B in a Y-axis direction.

(A): A projected waveform on a Y axis of an area (an area enclosed by the dotted line shown in FIG. 3A and 3B) corresponding to an upper portion of a pattern in an SEM image is generated (in FIG. 3C, a longitudinal axis SE intensity indicates the brightness of the SEM image, and a lateral axis Y indicates the position). The brightness variation of the projected waveform is represented by the standard deviation $\sigma$ to be used as a roughness index value, that is, a resist film thickness reduction index value. As the roughness becomes larger, variations in brightness are increased, resulting in large standard deviation $\sigma$. FIG. 4B shows the projected waveforms on the Y axis for various amounts of film thickness reduction (as the reference number increases from (i) to (v), the amount of film thickness reduction becomes larger). As shown in the figure, as the amount of film thickness reduction becomes large, the index value takes a large one. According to this method, since a certain zone is projected to enable decreasing the influence of high frequency noise specific to the SEM by an averaging effect, the brightness variation due to the surface roughness can be detected with good sensitivity. The averaging processing is performed in the direction of width of a pattern line, which can reduce an influence of change in brightness due to a change in shape of the pattern other than the film thickness reduction. An area of the pattern in the longitudinal direction for generating the projected waveform is made longer, which can improve the high accuracy of the film thickness reduction index value. In graphs shown in (i) to (v) in FIG. 4B, the longitudinal axis and the lateral axis are the same as those shown in FIG. 3C, and a description thereof is omitted below.

Figure 3D:
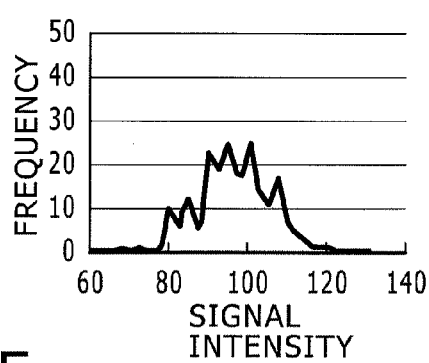
FIG. 3D is a histogram showing distribution of signal intensities of the signal waveform shown in FIG. 3C.

(B): A brightness histogram of an area corresponding to the pattern upper portion in the SEM image (enclosed by the dotted line shown in FIGS. 3A and 3B) is made (see FIG. 3D), and then the histogram is applied to a normal distribution. At that time, the σ value or the center of the normal distribution is used as a resist film thickness reduction index value. Specifically, the histogram is made by determining an appearance frequency for each brightness on the longitudinal axis from the projected waveform onto the Y axis determined by the above-mentioned method (A). The concept of this method is the same as that of the above method (A). This method involves qualifying by use of the feature that as the roughness becomes larger, the brightness variation is increased averagely toward the brighter level. FIG. 4C shows a histogram of each of various amounts of film thickness reduction (as the reference number increases from (i) to (v), the amount of film thickness reduction becomes large). Also, as the amount of film thickness reduction becomes larger, the index value takes a larger one. In the graphs shown in (i) to (v) in FIG. 4C, the longitudinal axis and the lateral axis are the same as those shown in FIG. 3D, and a description thereof is omitted below.

Figure 3E:
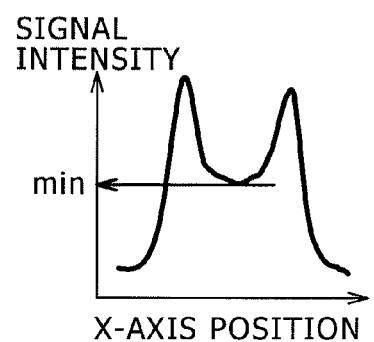
FIG. 3E is a diagram showing a signal waveform obtained by adding up SEM image signals shown in FIG. 3A or 3B in an X-axis direction.

(C): A projected waveform of the SEM image on the X axis is generated, and the minimum value of the center of the waveform (indicated by "min" shown in FIG. 3E) is set as the film thickness reduction index value. The edge having some surface roughness is detected to be bright in the streaky manner with increasing roughness. Thus, this method involves qualifying by use of the feature that as the roughness becomes larger, the brightness is increased averagely. FIG. 4D shows a projected waveform on the X axis of each of various amounts of film thickness reduction (as the reference number increases from (i) to (v), the amount of film thickness reduction becomes large). Also, as the amount of film thickness reduction becomes large, the index value takes a large one. This method advantageously has an excellent effect of reducing SEM noise by averaging over a wide area. This index value is apt to be influenced by a change in shape other than the film thickness roughness, in particular, together with the change in shape of the pattern top portion. Thus, the index value is effective for an object whose change in shape other than the film thickness reduction is small. In the graphs shown in (i) to (v) in FIG. 4D, the longitudinal axis and the lateral axis are the same as those shown in FIG. 3E, and a description thereof is omitted below.

(D): A method for texture analysis can be applied as disclosed in Mikio Takagi and Haruhisa Shimoda, Ed. "Image Analysis handbook", University of Tokyo Press, Function I, chapter 2 (1991). That is, a power spectrum of an area corresponding to the upper portion in the SEM image is determined, and the roughness of a texture is quantified from frequency properties. Alternatively, another method for quantifying the features of the image can involve combining some of the above various methods together. A further method can involve weighting and adding up various index values in use.

[Method for Making Database 20]

FIG. 1C shows a flowchart for making the database 20 stored in the database section 113.

(Step S11): Samples with resist patterns formed under various exposure conditions are prepared for making the database 20. For example, a focus exposure matrix (FEM) wafer may preferably be used. The FEM wafer has the focus position and dose amount of one wafer changed as exposure conditions within a range in which these conditions can be varied.

(Step S12): SEM images of the resist pattern samples prepared and formed under the various exposure conditions are obtained, and then film thickness reduction index values are calculated by any one of the methods (A) to (D) described in the above paragraph "Calculation of Film Thickness Reduction Index Value".

(Step S13): The height of the resist pattern of each same sample is measured by height measuring means, such as an atom force microscope (AFM), a scatterometry (lightwave scattering measurement), or observation of a pattern section using the SEM, thereby to determine the amount of film thickness reduction of the resist. Instead of actually measuring the height of the pattern, the height determined by calculating the sectional shape of the resist pattern under each of the various exposure conditions by an exposure simulation may be used.

(Step S14): The relationship between the thus-obtained amount of film thickness reduction and the film thickness reduction index value is shown in the graph 21. As mentioned above, the larger the amount of film thickness reduction, the larger the film thickness reduction index value. In response to the result, an approximate function is calculated as the relationship between the amount of film thickness reduction and the film thickness reduction index value. At the same time, variations in amount of film thickness reduction respective to the film thickness reduction index value may be calculated. A look-up table format may be used in place of the approximate function.

(Step S15): The approximate function calculated as the relationship between the amount of film thickness reduction and the film thickness reduction index value is stored in the database. The relationship of variations in amount of the film thickness reduction with respect to the calculated film thickness reduction index value is stored in the database.

(Verification Against Database and Estimation of Amount of Film Thickness Reduction)

Steps S3 and S4 shown in FIG. 1B will be described below in detail. In step S3 shown in FIG. 1B, an absolute value of the amount of film thickness reduction is estimated by substituting the index value calculated in step S2 into the approximate function calculated as the relationship between the amount of film thickness reduction and the film thickness reduction index value by the above database 20, or by referring to the look-up table based on the relationship between the amount of film thickness reduction and the film thickness reduction index value. The use of the index value calculated in step S2 can grasp an error of the above estimation result of the amount of film thickness reduction from the relationship of variations in amount of film thickness reduction with respect to the index value which relationship is stored in the database 20.

[GUI]

Figure 5:
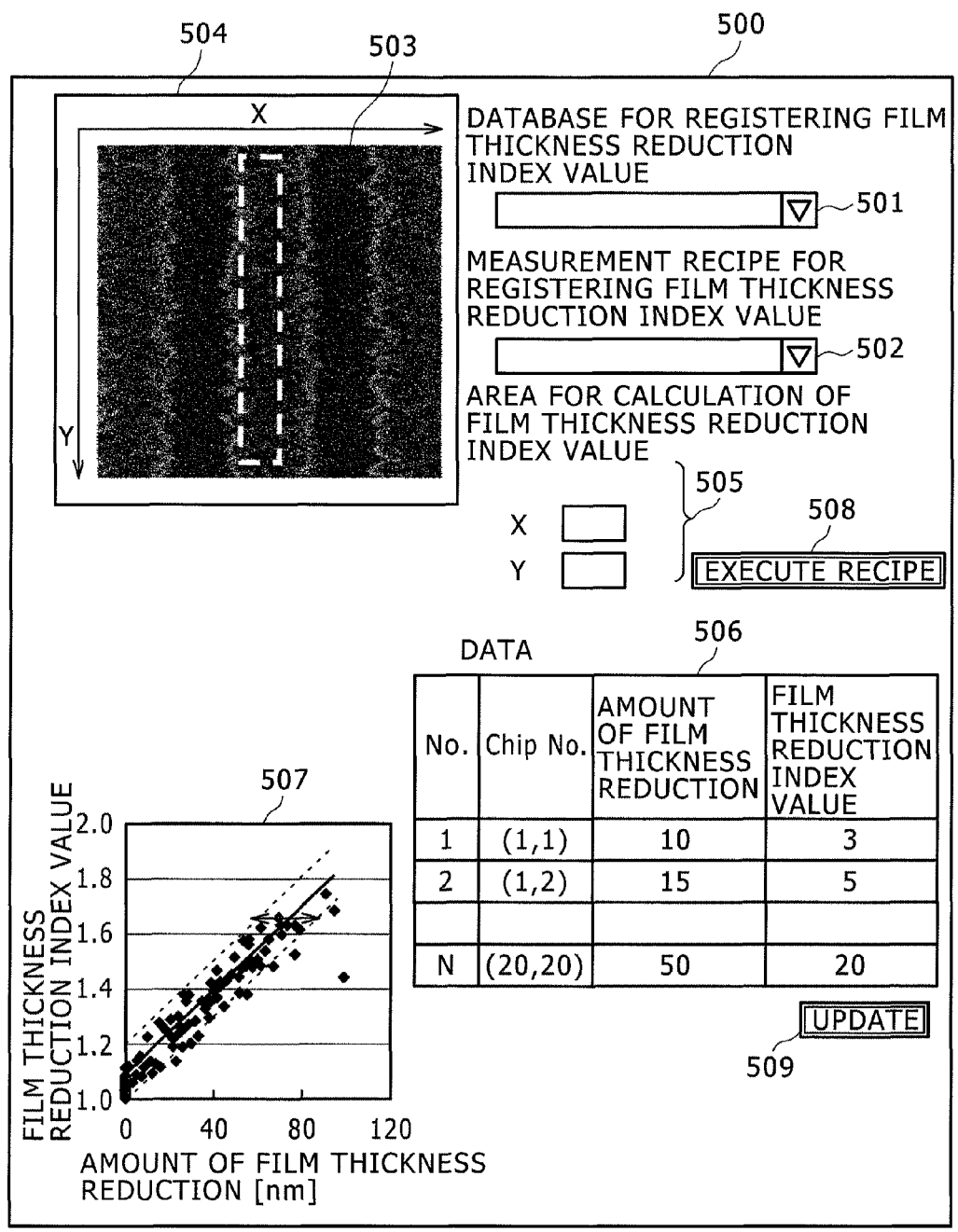
FIG. 5 shows a GUI screen for registering the relationship between the film thickness reduction index value and the amount of film thickness reduction in the first embodiment.

FIG. 5 shows an example of a graphic user interface (GUI) screen 500, which is one example of an input and output screen of the input and output section 115 of the SEM system in this embodiment. The GUI screen includes an input screen required to form and update the database 20 of the database section 113 for previously storing the relationship between the film thickness reduction amount and the film thickness reduction index value.

The GUI screen 500 includes an input portion 501 for inputting a name of the database 20 to be newly registered or updated. The GUI screen 500 displays information selected from the database 20 according to the name input in the form of a data list 506 and a graph 507. The GUI screen 500 also includes a portion 502 for selecting a measurement recipe for obtaining a film thickness reduction index value for registration, and an image display area 504 for displaying an image 503 registered in the recipe selected. The GUI screen 500 further includes a portion 505 for selecting an area on the SEM image used for calculation of the film thickness reduction index value on the image 503 displayed.

After inputting these items, a cursor (not shown) is moved to a button 508 for execution of the recipe and then a mouse (not shown) is clicked, whereby calculation of a film thickness reduction index value is performed based on the set conditions. Data about the film thickness reduction index value calculated is automatically updated, and then the data list 506 is also corrected. Further, data about the amount of film thickness reduction obtained by another device or means can be input into the data list 506 displayed on the screen 500. In order to store the input data in the database 20, an updating button 509 may be preferably clicked. This operation is performed to make the relationship between the amount of film thickness reduction and the film thickness reduction index value in the form of function, which is registered in the database 20.

Figure 6:
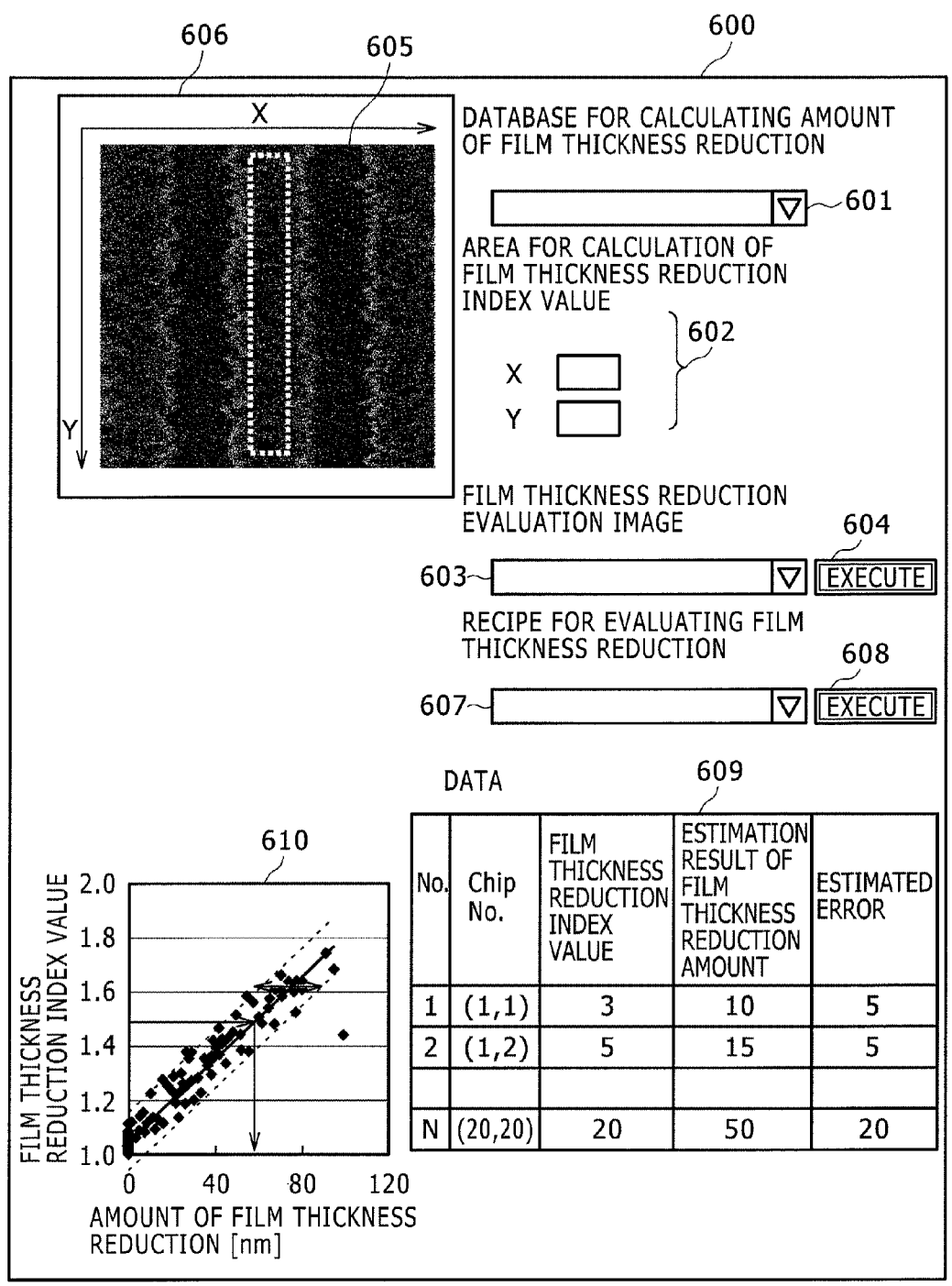
FIG. 6 shows an output screen of estimation results of the amounts of film thickness reduction in the first embodiment.

The input and output section 115 of the SEM system further displays a GUI screen 600 which includes a setting section for verification against the information in the database 20 and for estimation of the amount of film thickness reduction, and an output section for displaying the result. FIG. 6 shows an example of the GUI screen 600.

In setting a measurement condition, the GUI screen 600 includes a portion 601 for selecting the database 20 for calculation of the film thickness reduction amount for reference, and a portion 602 for displaying an area for use in the film thickness reduction index value on the SEM image automatically obtained by the selection based on the information in the database. The GUI screen 600 further includes a portion (film thickness reduction evaluation image selector) 603 for selecting an image for evaluating the amount of film thickness reduction from the sets of images obtained, and an exertion button 604 for instructing calculation of the film thickness reduction index value for the selected image and for estimation of the amount of film thickness reduction. The GUI screen 600 also includes a portion 606 for displaying the selected image 605.

The GUI screen 600 further includes a portion (a recipe selector for evaluation of film thickness reduction) 607 for selecting a measurement recipe, and an execution button 608 for calculation of the film thickness reduction index value and for estimation of the amount of film thickness reduction based on the recipe selected. The cursor (not shown) is moved to the execution button 608 on the screen 600 and then the mouse (not shown) is clicked, whereby calculation of a film thickness reduction index value and estimation of the amount of film thickness reduction are performed based on the set conditions. The result is displayed in the form of the graph 610 and the data list 609 together with estimated errors.

As mentioned above, the invention can detect and measure the film thickness reduction using the image, which has been used by a conventional line width measurement method, and thus can monitor the film thickness reduction without reducing a throughput of the conventional process management. The invention may be applied to extraction of conditions for the exposure process, that is, optimization of the dose amount and focus position in exposure. The condition for preventing the occurrence of film thickness reduction is incorporated, which can set a more effective process window as compared to the use of only the conventional line width.

(Second Embodiment)

Figure 7A:
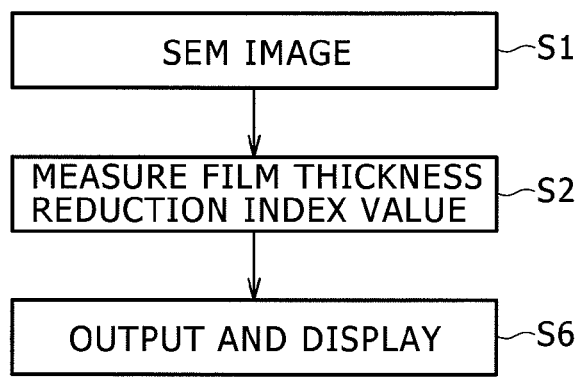
FIG. 7A is a flowchart showing a flow of a process for calculating and outputting a film thickness reduction index value in a second embodiment.

A second embodiment of the invention is shown in FIG. 7. In the first embodiment, the film thickness reduction index value is calculated from the SEM image (in step S2), and then is verified against the database (in step S3), whereby the absolute value of the film thickness reduction amount is estimated (in step S4), and the film thickness reduction index value and the amount of film thickness reduction are output. However, in the second embodiment, only the calculation of the film thickness reduction index value from the SEM image is performed (in step S2) without estimating the amount of film thickness reduction in steps S3 and S4, so that only information regarding the film thickness reduction index value is output (in step S6). A method for calculating the film thickness reduction index value from the SEM image in this embodiment (in step S2) is the same as that described in the first embodiment.

Figure 7B:
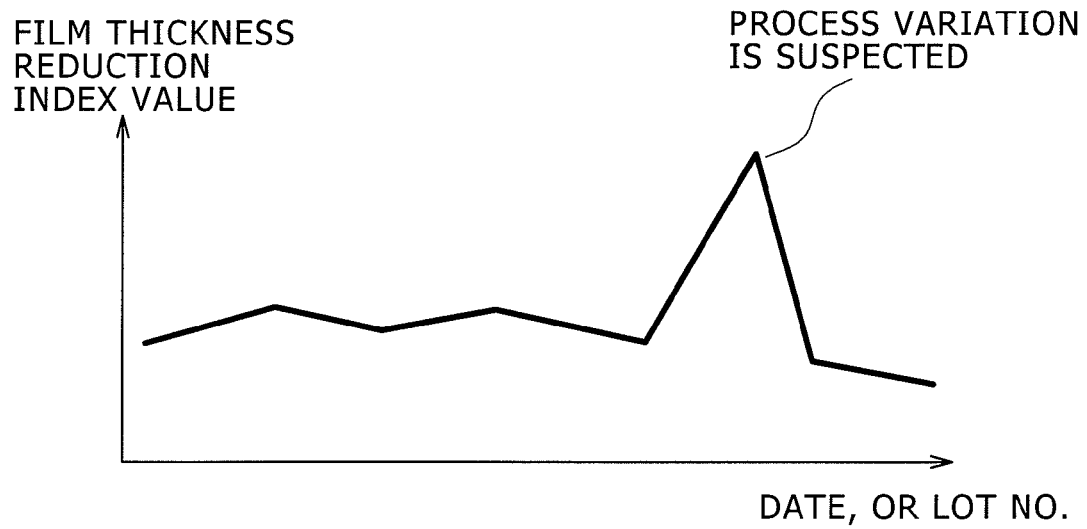
FIG. 7B is a graph showing a trend of change in film thickness reduction index value.

GUI screens of the input and output section of this embodiment are basically the same as those described in FIGS. 5 and 6 except that the column for the amount of film thickness reduction provided in the data list 506 shown in FIG. 5 is not provided, and that the columns for the estimation result of the film thickness reduction amount and for the estimated error provided in the data list 609 shown in FIG. 6 are not provided. FIG. 7B shows other examples of outputs in this embodiment.

According to this embodiment, the index value represents a relative change in amount of film thickness reduction. As shown in FIG. 7B, the trend of the index value is monitored, whereby the process variation can be monitored.

(Third Embodiment)

A third embodiment of the invention is shown in FIG. 8. Although the first and second embodiments have described the method for measuring the resist pattern formed on the wafer, this embodiment has an object to detect a decrease in line width of a circuit pattern formed on a wafer together with the film thickness reduction of a resist pattern in the case of etching using the resist pattern as a mask.

This embodiment employs a database 30 which registers a relationship between a resist line width and an etching bias, that is, between a line width of a resist pattern and a line width of the pattern etched, instead of the database for registering the relationship between the amount of film thickness reduction and the film thickness reduction index value in the first embodiment thereby to estimate an etching bias from the result of measurement of the film thickness reduction index value (in steps S23 and S24).

Now, a method for making the database 30, and an SEM system employing the method will be described below.

[SEM System]

Figure 8A:
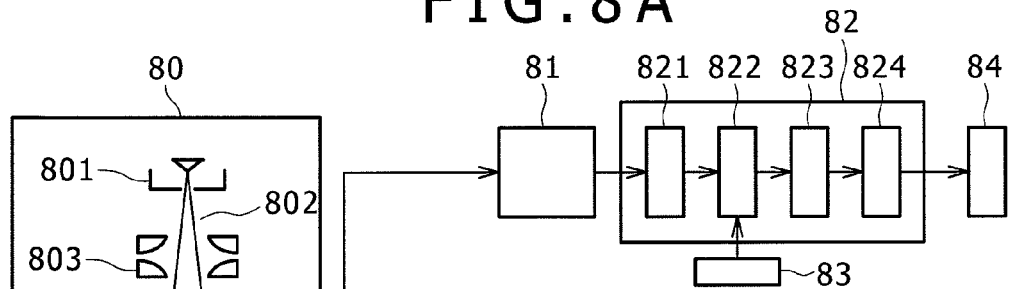
FIG. 8A is a diagram showing a configuration of the length-measuring SEM system having a function of measuring film thickness reduction according to a third embodiment.

FIG. 8A shows the configuration of a length-measuring SEM system including a function of measuring the film thickness reduction in this embodiment. The length-measuring SEM system of this embodiment includes an SEM main unit 80, an image processing and whole controller 81, an arithmetic processor 82, and a database section 83. The SEM system is connected to a data server 84 via a network. The configurations of the SEM main unit 80 and the image processing and whole controller 81 are the same as those of the first embodiment described with reference to FIG. 1A.

In this embodiment, the SEM image output from the image processing and whole controller 81 is processed in use by the arithmetic processor 82 with reference to information stored in the database section 83, and information regarding an etch bias is extracted. The result is fed to and stored in the data server 116 via a communication line.

The arithmetic processor 82 includes a film thickness reduction index value measuring section 821, a database verification section 822, an etch bias estimation section 823, and an input and output section 824 having a display screen.

[Entire Flow]

Figure 8B:
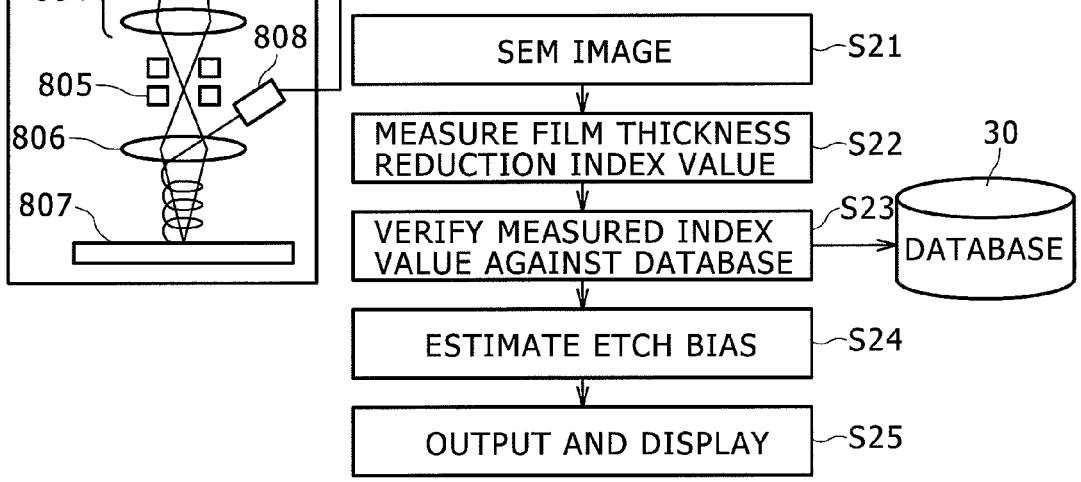

FIG. 8B shows an entire flowchart of estimation of an etch bias performed by the arithmetic processor 82.

(Step S21): A resist pattern is imaged by the SEM 80, and a signal obtained by the imaging is processed by the image processing and whole controller 81 to obtain an SEM image of a specimen.

(Step S22): A film thickness reduction index value is calculated from the obtained image in the same way as that in step S2 of the first embodiment.

(Step S23): The calculated index value is verified against the database 30 stored in the database section 83 for registering the relationship between the line width of the resist pattern and the line width of the pattern etched. A method for making the database 30 will be described later using FIG. 8C.

(Step S24): An etch bias is estimated based on the result of verification.

(Step S25): The estimated result is displayed on the display screen of the input and output section 824, and is then fed to and stored in the data server 84 via a communication line.

The entire flow of estimation of the etch bias in this embodiment has been described above. The details of the main flow will be described below.

[Method for Making Database]

Figure 8C:
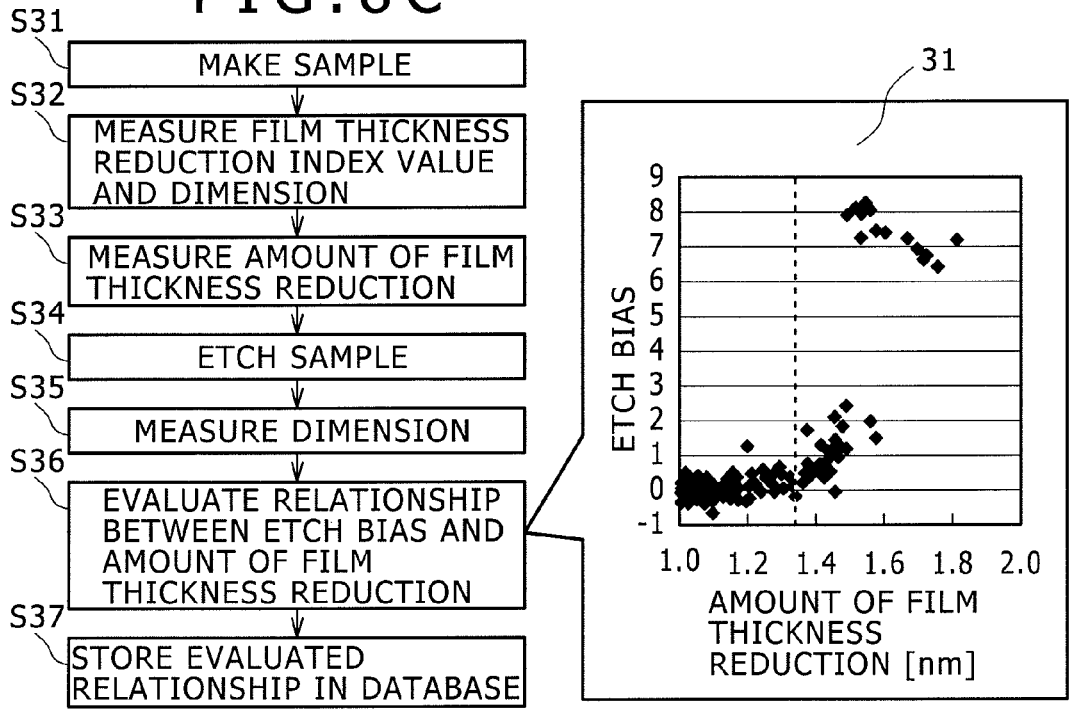

FIG. 8C shows the flow for making the database 30 for registering the relationship between the line width of the resist pattern and the line width of the pattern etched in this embodiment.

(Step S31): Samples with resist patterns formed under various exposure conditions are prepared in the same way as that described in step S11 of the first embodiment.

(Step S32): The film thickness reduction index value is calculated, and the line width of the pattern is measured in the same way as that in step S12 of the first embodiment.

(Step S33): The height of the resist pattern is measured in the same way as that described in step S13 of the first embodiment thereby to determine the amount of film thickness reduction of the resist.

(Step S34): A wafer with the resist pattern formed thereon is subjected to etching.

(Step S35): The line width of the pattern formed on the wafer by the etching is measured. The wafer used in this step may be the same as that used in steps S32 and S33, or alternatively, may be another wafer obtained by the same process. Data about the measured line width of the pattern formed on the wafer etched is stored in relation to data about the dimension of the resist pattern measured in step S32, and the height of the resist pattern measured in step S33.

(Step S36): A relationship between the amount of film thickness reduction of the resist determined in step S33 and an etching bias which is a difference between the line width of the resist pattern determined in step S32 and the line width of the etched pattern determined in step S35 is determined.

One example of the relationship determined is represented in a graph 31. Based on the result, an approximate function is calculated, and the relationship between the etching bias and the film thickness reduction index value is determined.

(Step S37): A relationship between the etching bias determined and the film thickness reduction index value is stored in the database 30. At the same time, the film thickness reduction index value at which the etching bias increases is stored as a threshold, and further, variations in etching bias with respect to the film thickness reduction index value is calculated and then stored in the database 30.

[Estimation of Etching Bias]

In step S24 of estimating an etching bias as shown in FIG. 8B, the film thickness reduction index value calculated in step S22 is substituted into the approximate function on the database 30 calculated by the above step S36 thereby to estimate an etching bias. Alternatively, it is determined whether or not the etching bias exceeds the threshold.

[GUI]

Figure 9:
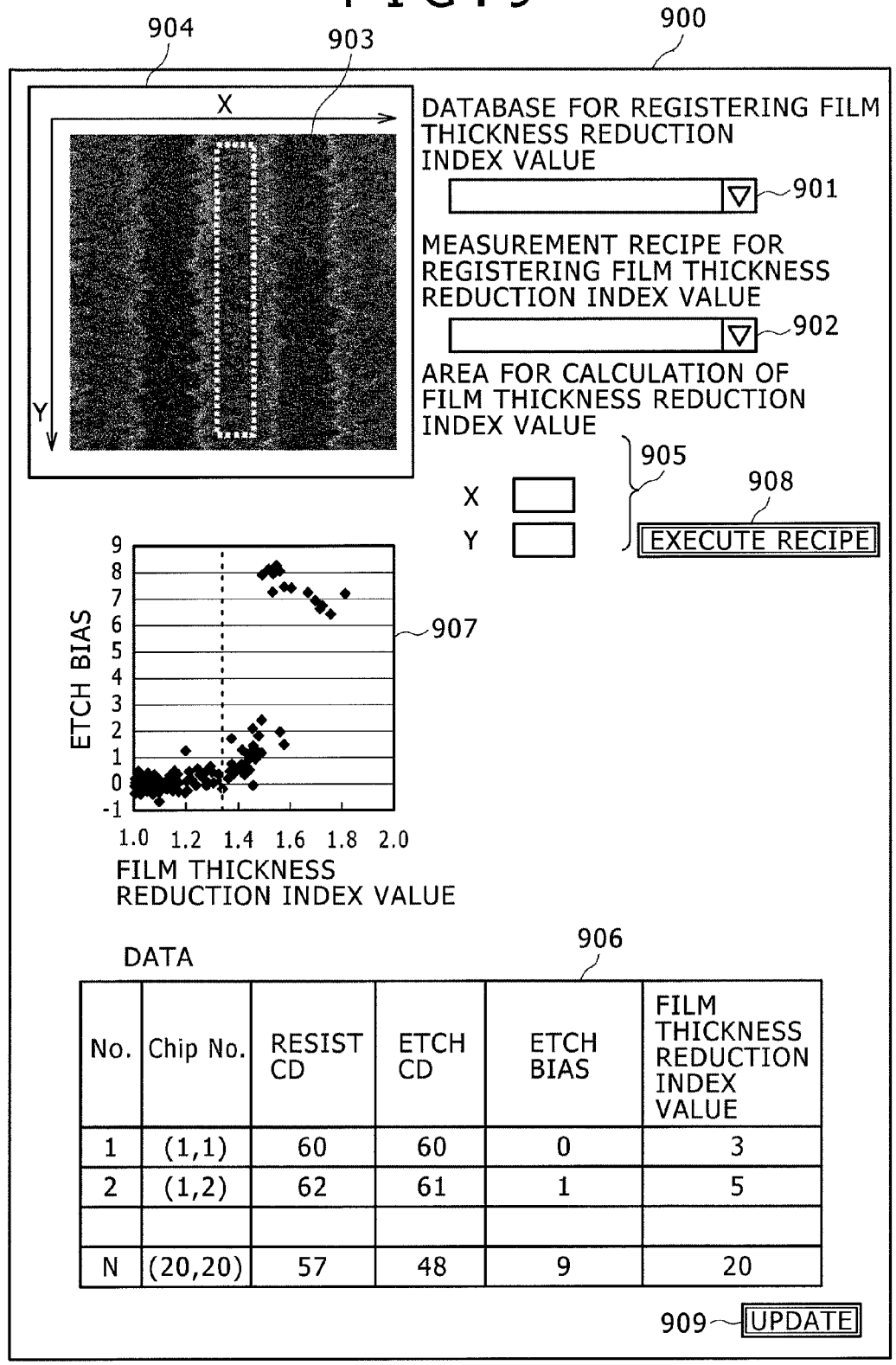
FIG. 9 shows a GUI screen for registering the relationship between the film thickness reduction index value and the etch bias in the third embodiment.
Figure 10:
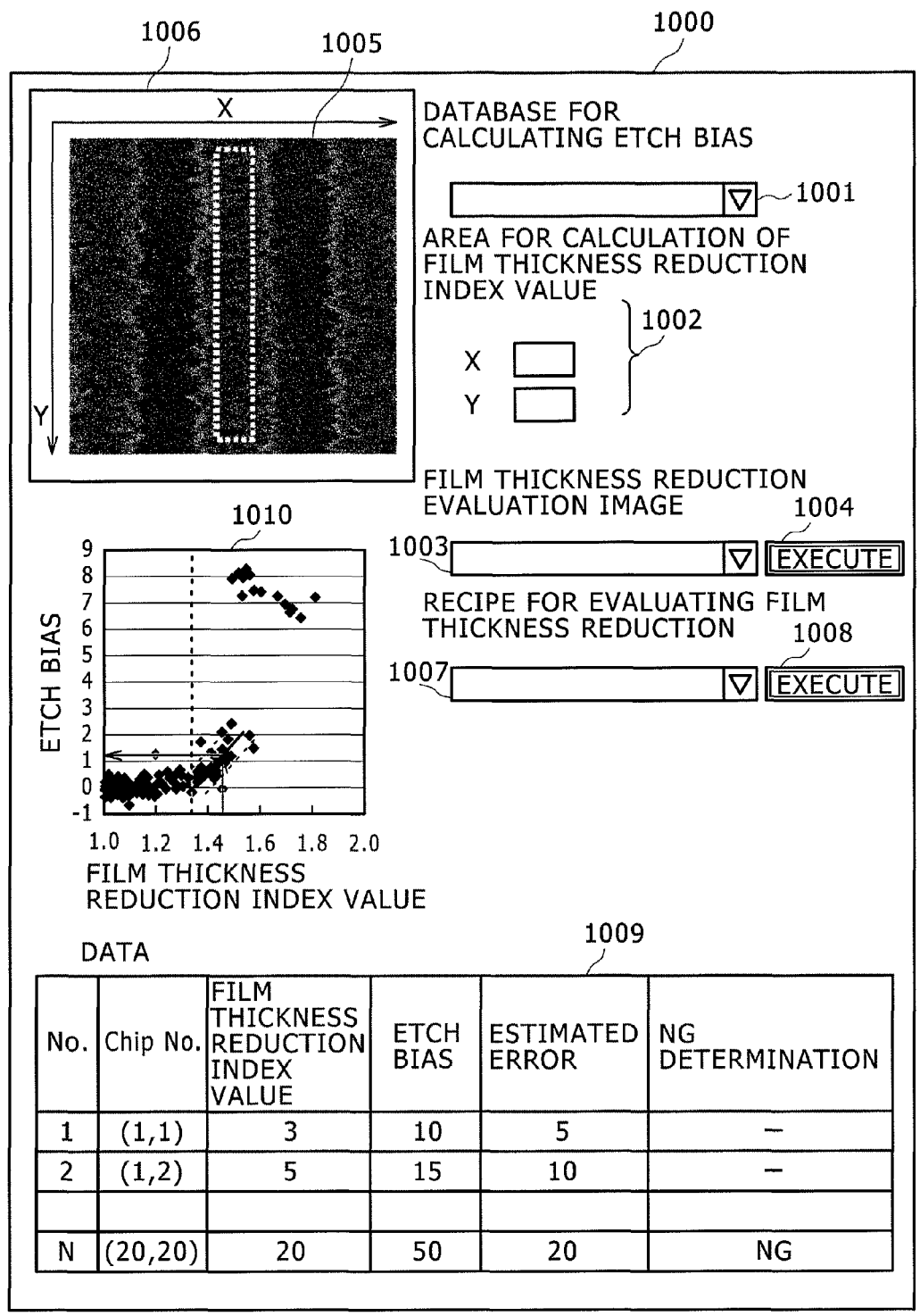
FIG. 10 shows an output screen of estimation results of the etch bias in the third embodiment.

FIG. 9 shows an example of the GUI screen 900 as one example of the input and output screen of the input and output section 84 of the SEM system according to this embodiment. The GUI screen is the same as one obtained by replacing the amount of film thickness reduction by the etch bias on the GUI screen shown in FIG. 5 of the first embodiment.

More specifically, the GUI screen 900 includes an input portion 901 for inputting a name of the database 30 to be newly registered or updated. The GUI screen 900 displays information selected from the database 30 according to the name input in the form of a data list 906 and a graph 907. The data list 906 of this embodiment displays an etching bias value in addition to the film thickness reduction index value of the resist pattern, in place of the column for the film thickness reduction amount at the data list 506 of the first embodiment shown in FIG. 5. The etching bias value is a difference between a resist CD value (a dimension value of the resist pattern determined from the SEM image) and an etch CD value (a dimension value of the pattern formed on the wafer after etching which value is determined from the SEM image), and between a line width of the resist pattern (resist CD value) and a line width of the pattern etched (etch CD value). The graph 907 displayed in this embodiment differs from the case of the first embodiment shown in FIG. 5 in that the relationship between the etch bias and the film thickness reduction index value is displayed.

On the other hand, the screen 900 includes a portion 902 for selecting a measurement recipe for obtaining a film thickness reduction index value for registration, an image display area 904 for displaying an image 903 registered in the selected recipe, and a portion 905 for selecting an area on the SEM image for use in calculation of the film thickness reduction index value on the displayed image 903. The screen 900 also includes a button 908 for executing the recipe after inputting these items, and a data list 906 adapted to be corrected by calculating the film thickness reduction index value based on the above set conditions, and automatically updating data, like the first embodiment. Further, data about the amount of film thickness reduction obtained by another device or means can be input to the data list 906 displayed on the screen 900. The storage of the input data in the database 30 only requires clicking of an updating button 909. This operation makes the relationship between the amount of film thickness reduction and the film thickness reduction index value in the form of function, which is registered in the database 30.

The input and output section 824 of the SEM system displays a GUI screen 1000 including a setting section for estimating the amount of film thickness reduction by verification against the information of the database 30, and an output section for displaying the result. The GUI screen 1000 has a similar structure to that of the GUI screen 600 shown in FIG. 6 as described in the first embodiment.

Like the first embodiment described above, in setting a measurement condition, the GUI screen 1000 includes a portion 1001 for selecting the database 30 for calculation of the film thickness reduction amount for reference, and a portion 1002 for displaying an area for use in the film thickness reduction index value on the SEM image automatically obtained by the selection based on the information of the database. Further, the GUI screen 1000 also includes a portion (film thickness reduction evaluation image selector) 1003 for selecting an image for evaluating the amount of film thickness reduction from the sets of images obtained, and an exertion button 1004 for instructing calculation of the film thickness reduction index value and for estimation of the amount of film thickness reduction for the selected image. The GUI screen 1000 further includes a portion 1006 for displaying an image 1005 selected.

The GUI screen 1000 further includes a portion (recipe selector for evaluation of film thickness reduction) 1007 for selecting a measurement recipe, and an execution button 1008 for calculation of the film thickness reduction index value and for estimation of the amount of film thickness reduction based on the recipe selected. The cursor (not shown) is moved to the execution button 1008 on the screen 1000 and then the mouse (not shown) is clicked thereby to perform calculation of a film thickness reduction index value and of an etch bias, estimation of an error of the amount of film thickness reduction, and determination of NG, based on the set conditions. The results are displayed in the data list 1009, and the relationship between the etch bias and the film thickness reduction index value is displayed as the graph 1010.

According to this embodiment, as shown in the graph 31 of FIG. 8, the relationship between the amount of film thickness reduction and the dimension of the pattern etched is not linear. When the amount of film thickness reduction exceeds a certain value, the etch bias quickly increases. This embodiment can determine whether or not the film thickness reduction caused is at a problematic level from a viewpoint of device characteristics.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An electron microscope system, comprising:
   electron beam image obtaining means for obtaining an image of a specimen having a resist pattern formed on a surface thereof using a scanning electron microscope;
   quantifying means for quantifying a feature of variations in brightness of the image at a desired area of the resist pattern by processing the obtained image;
   index value calculating means for calculating an index value for relating the feature of variations in brightness of the image quantified by the quantifying means to an amount of reduction from a reference value of a film thickness of the resist pattern;
   estimation means for estimating the amount of reduction from the reference value of the film thickness of the resist pattern using the index value calculated by the index value calculating means; and
   display means for displaying information about the amount of reduction from the reference value of the film thickness of the resist pattern calculated by the estimation means on a screen,
   wherein the index value is correlated with changes in roughness of a surface of the resist pattern at the desired area,
   further comprising means for verifying the calculated index value against a database which registers a relationship between film thickness reduction index values and amounts of film thickness reduction of patterns actually formed based on a resist pattern formed under predetermined exposure conditions stored in a database section.

2. The electron microscope system according to claim 1, wherein the index value calculating means calculates the index value for relating the feature of variations in brightness of the image quantified by the quantifying means to the amount of reduction from the reference value which is the film thickness of the resist pattern formed by being exposed under a normal exposure condition.

3. The electron microscope system according to claim 1, wherein the estimation means estimates an amount of film thickness reduction of the resist pattern by applying the index value calculated by the index value calculation means to a database previously made and stored for relating an index value for a resist pattern having a reference film thickness to an amount of film thickness reduction of the resist pattern.

4. The electron microscope system according to claim 1, wherein the index value having a correlation with the amount of film thickness reduction calculated from the electron microscope image is a quantified degree of roughness of the desired area of the resist pattern caused by a phenomenon of the film thickness of the resist pattern with respect to the reference thickness of the resist pattern as a reference.

5. The electron microscope system according to claim 4, wherein the index value having the correlation with the amount of film thickness reduction calculated from the electron microscope image is a quantified average brightness of the desired area of the resist pattern.

6. The electron microscope system according to claim 4, wherein the index value having the correlation with the amount of film thickness reduction calculated by the electron microscope image is a quantified distribution of the brightness of the desired area of the resist pattern.

7. A method for evaluating film thickness reduction of a resist pattern using an electron microscope system, the method comprising the steps of:
   obtaining an image of a specimen having a resist pattern formed on a surface thereof using a scanning electron microscope;
   quantifying a feature of variations in brightness of the image at a desired area of the resist pattern by processing the obtained image;
   calculating an index value for relating the feature of variations in brightness of the image quantified to an amount of reduction from a reference value of a film thickness of the resist pattern;
   estimating the amount of reduction from the reference value of the film thickness of the resist pattern using the calculated index value; and
   displaying information about the amount of reduction from the reference value of the film thickness of the resist pattern estimated on a screen,
   wherein the index value is correlated with changes in roughness of a surface of the resist pattern at the desired area, further comprising a step for verifying the calculated index value against a database which registers a relationship between film thickness reduction index values and amounts of film thickness reduction of patterns actually formed based on a resist pattern formed under predetermined exposure conditions stored in a database section.

8. The method according to claim 7, wherein the step of calculating the index value for relating the feature of variations in brightness to the amount of reduction from the reference value of the film thickness of the resist pattern involves calculating the index value for relating the feature of variations in brightness of the image quantified to the amount of reduction from the reference value which is the film thickness of the resist pattern formed by being exposed under a normal exposure condition.

9. The method according to claim 7, wherein the step of estimating the amount of reduction from the film thickness reference value of the resist pattern involves estimating the amount of reduction of the resist pattern by applying the calculated index value to a database previously made and stored for relating the index value for the resist pattern having a reference film thickness to an amount of film thickness reduction of the resist pattern.

10. The method according to claim 7, wherein the index value having a correlation with the amount of film thickness reduction calculated from the electron microscope image is a quantified degree of roughness of the desired area of the resist pattern caused by film thickness reduction of the resist pattern with respect to the film thickness of the resist pattern as a reference.

11. The method according to claim 10, wherein the index value having the correlation with the amount of film thickness reduction calculated from the electron microscope image is a quantified average brightness of the desired area of the resist pattern.

12. The method according to claim 10, wherein the index value having the correlation with the amount of film thickness reduction calculated from the electron microscope image is a quantified distribution of the brightness of the desired area of the resist pattern.

* * * * *